(12) United States Patent
Sano et al.

(10) Patent No.: US 11,749,596 B2
(45) Date of Patent: Sep. 5, 2023

(54) WIRING SUBSTRATE

(71) Applicant: IBIDEN CO., LTD., Gifu (JP)

(72) Inventors: Katsuyuki Sano, Ogaki (JP); Yoji Sawada, Ogaki (JP)

(73) Assignee: IBIDEN CO., LTD., Ogaki (JP)

(*) Notice: Subject to any disclaimer, the term of this patent is extended or adjusted under 35 U.S.C. 154(b) by 117 days.

(21) Appl. No.: 17/452,123

(22) Filed: Oct. 25, 2021

(65) Prior Publication Data

US 2022/0165653 A1 May 26, 2022

(30) Foreign Application Priority Data

Nov. 20, 2020 (JP) .................................. 2020-193599

(51) Int. Cl.
*H01L 21/48* (2006.01)
*H01L 23/498* (2006.01)

(52) U.S. Cl.
CPC ...... *H01L 23/49838* (2013.01); *H01L 21/486* (2013.01); *H01L 21/4857* (2013.01); *H01L 23/49811* (2013.01); *H01L 23/49822* (2013.01)

(58) Field of Classification Search
CPC ......... H01L 23/49822; H01L 23/49811; H01L 21/486; H01L 21/48; H01L 23/498; H01L 23/49838

USPC ......................................................... 174/266
See application file for complete search history.

(56) References Cited

U.S. PATENT DOCUMENTS

| | | | | |
|---|---|---|---|---|
| 7,985,928 | B2* | 7/2011 | Bolom | H01L 23/5226 |
| | | | | 174/262 |
| 2008/0257595 | A1* | 10/2008 | Hu | H01L 24/11 |
| | | | | 29/846 |
| 2008/0290528 | A1* | 11/2008 | Hsu | H01L 23/49838 |
| | | | | 257/779 |

FOREIGN PATENT DOCUMENTS

JP 2014-103295 A 6/2014

* cited by examiner

*Primary Examiner* — Tremesha S Willis
(74) *Attorney, Agent, or Firm* — Oblon, McClelland, Maier & Neustadt, L.L.P.

(57) ABSTRACT

A wiring substrate includes a conductor pad, an insulating layer formed on the conductor pad such that the insulating layer is covering the conductor pad and has a through hole, a bump formed on the conductor pad such that the bump is formed in the through hole penetrating through the insulating layer. The conductor pad is formed such that the conductor pad has a connecting surface connected to the bump, a concave part formed on the connecting surface of the conductor pad to the bump, and a convex part formed in the concave part.

20 Claims, 6 Drawing Sheets

WIRING SUBSTRATE

CROSS-REFERENCE TO RELATED APPLICATIONS

The present application is based upon and claims the benefit of priority to Japanese Patent Application No. 2020-193599, filed Nov. 20, 2020, the entire contents of which are incorporated herein by reference.

BACKGROUND OF THE INVENTION

Field of the Invention

The present invention relates to a wiring substrate having a bump.

Description of Background Art

Japanese Patent Application Laid-Open Publication No. 2014-103295 describes a wiring substrate having a bump electrode formed on a connection pad having a concave part on a surface thereof. A metal layer is formed on the connection pad with an inner surface (bottom surface) of the concave part as a connecting surface, and a solder bump as a bump electrode is formed on the metal layer. The bottom surface of the concave part of the surface of the connection pad has a gentle curved surface. The entire contents of this publication are incorporated herein by reference.

SUMMARY OF THE INVENTION

According to one aspect of the present invention, a wiring substrate includes a conductor pad, an insulating layer formed on the conductor pad such that the insulating layer is covering the conductor pad and has a through hole, a bump formed on the conductor pad such that the bump is formed in the through hole penetrating through the insulating layer. The conductor pad is formed such that the conductor pad has a connecting surface connected to the bump, a concave part formed on the connecting surface of the conductor pad to the bump, and a convex part formed in the concave part.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
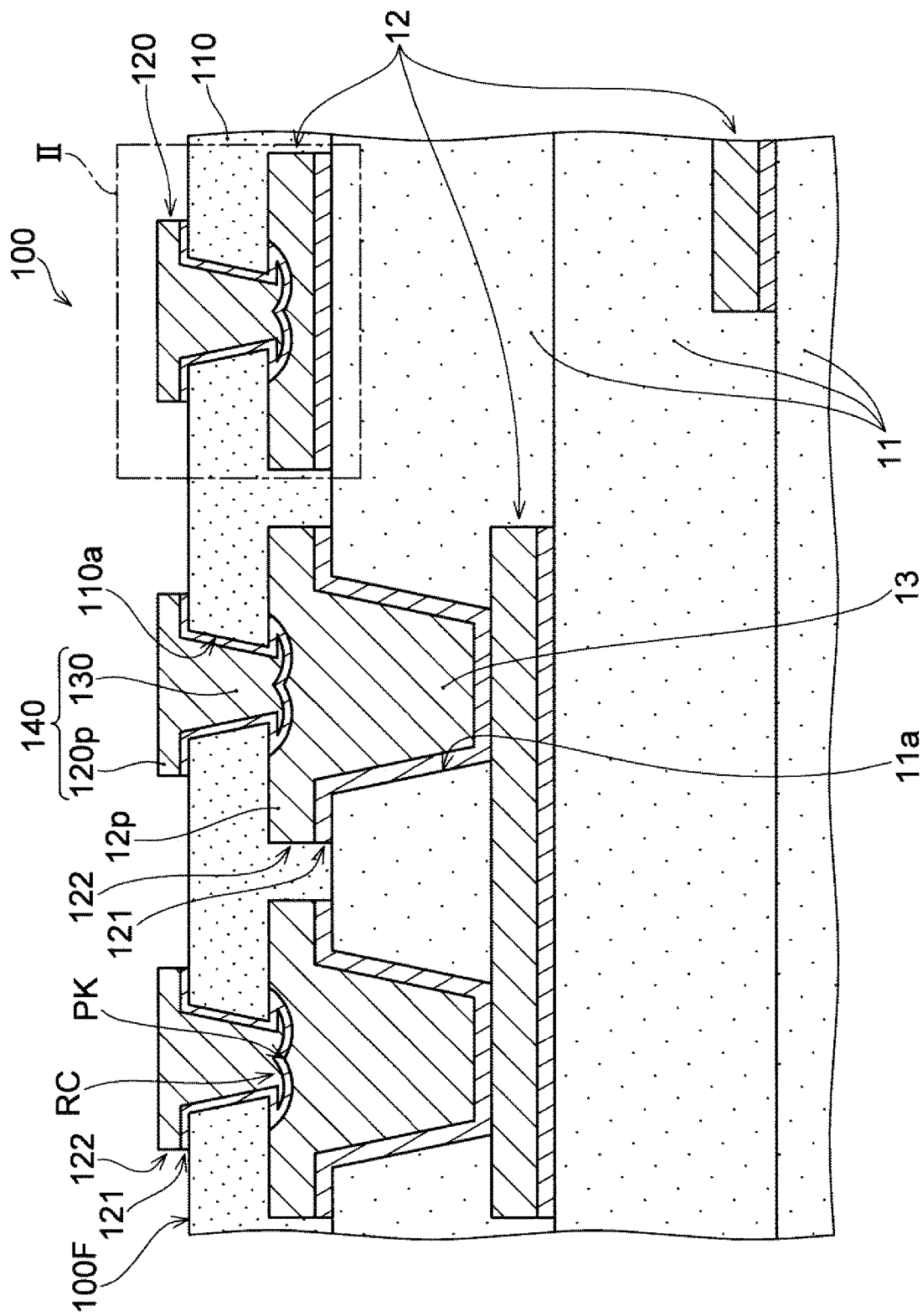
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

FIG. 1 partially illustrates a cross section of a wiring substrate 100, which is an example of the wiring substrate of the present embodiment. The wiring substrate 100 is formed of alternately laminated insulating layers and conductor layers, and FIG. 1 illustrates insulating layers (11, 110) and conductor layers (12, 120), which are some of the alternately laminated insulating layers and conductor layers. A surface (100F) on one side of the wiring substrate 100 illustrated in FIG. 1 is formed as a component mounting surface on which an external electronic component such as a semiconductor element is mounted.

A surface (not illustrated in the drawings) of the wiring substrate 100 on the opposite side with respect to the component mounting surface (100F) is formed as a connecting surface used for connecting to a motherboard of an electronic device or a package substrate of a semiconductor device having a laminated structure. The component mounting surface (100F) of the wiring substrate 100 illustrated in FIG. 1 is formed of surfaces of the outermost coating insulating layer 110 among the insulating layers forming the wiring substrate 100 and the outermost conductor layer 120 among the conductor layers forming the wiring substrate 100.

In the description of the wiring substrate of the present embodiment, of each element of the wiring substrate 100, a side closer to the component mounting surface (100F) of the wiring substrate 100 is referred to as "upper," an "upper side," an "outer side," or simply "outer."

The wiring substrate of the embodiment includes one or more insulating layers and two or more conductor layers. FIG. 1 illustrates four insulating layers (three insulating layers 11 and one insulating layer 110) on the component mounting surface (100F) side among the multiple insulating layers of the wiring substrate 100, and illustrates four conductor layers (three conductor layers 12 and one conductor layer 120) among the multiple conductor layers of the wiring substrate 100. The number of the insulating layers and the number of the conductor layers of the wiring substrate are not particularly limited and can be increased or decreased as appropriate. By including more conductor layers in the wiring substrate, a larger and more complicated electrical circuit can be formed in the wiring substrate without increasing a planar size of the wiring substrate.

The conductor layers (12, 120) each can have any conductor pattern. Each conductor layer (12, 120) is electrically connected via conductors (13, 130) that are formed in an insulating layer (11, 110) to a conductor layer (12, 120) on the opposite side of the insulating layer (11, 110). In the example illustrated in FIG. 1, each of the via conductors (13, 130) has a tapered shape that is reduced in diameter toward the opposite side from the component mounting surface (100F) side. However, the shape of each of the via conductors (13, 130) is not limited to this. It is also possible that each of the via conductors (13, 130) has a shape that is reduced in diameter toward the component mounting surface (100F), or is formed in a cylindrical shape that has the same diameter in a thickness direction of the insulating layers (11, 110) and is substantially orthogonal to the conductor layers (12, 120). For convenience, the term "reduced in diameter" is used. However, a horizontal cross-sectional shape of each of the via conductors (13, 130) is not necessarily limited to a circular shape. The term "reduced in diameter" means that a longest distance between two points on an outer circumference of a horizontal cross section of each of the via conductors (13, 130) is reduced.

Among the three conductor layers 12 illustrated in FIG. 1, the conductor layer 12 closest to the component mounting surface (100F) includes conductor pads (12p). The conductor layer 120 forming the component mounting surface (100F) includes connection pads (120p). The conductor pads (12p) and connection pads (120p) are connected by the via conductors 130 filled in through holes (110a) penetrating the insulating layer 110.

The connection pads (120p) are integrally formed with the via conductors 130 and together with the via conductors 130 form bumps 140. That is, the connection pads (120p) form land parts of the bumps 140, which are formed on the conductor pads (12p). The land parts each protrude upward from the insulating layer 110 and spread in a planar direction of the wiring substrate 100. The bumps 140 can be electrically connected to connection pads of an external electronic component (not illustrated in the drawings) such as a semiconductor element via the land parts (connection pads) (120p). For example, the bumps 140 can be connected to connection terminals of an electronic component or the like via conductive connecting members such as solders.

At each of connecting parts of the conductor pads (12p) between the conductor pads (12p) and the bumps 140, a concave part (RC) that is recessed in a thickness direction of the conductor pads (12p) is formed. In the concave part (RC), a convex part (UP) is formed in which a portion of a bottom surface of the concave part (RC) rises toward the component mounting surface (100F). When the connecting parts between the bumps 140 and the conductor pads (12p) each have such a shape, as will be described in detail later, a relatively strong connection between the bumps 140 (via conductors 130) and the conductor pads (12p) can be achieved, and connection reliability between the bumps 140 and the conductor pads (12p) can be improved.

The insulating layers (11, 110) forming the wiring substrate 100 can be formed using any insulating resin such as an epoxy resin. A polyimide resin, a BT resin (bismaleimide-triazine resin), a polyphenylene ether resin, a phenol resin or the like can also be used. The insulating layers (11, 110) may each contain inorganic filler such as silica. In the wiring substrate 100 in the example illustrated in FIG. 1, the insulating layers (11, 110) do not each contain a core material. However, when necessary, the insulating layers (11, 110) may each contain a core material such as a glass fiber or an aramid fiber. By containing a core material, the wiring substrate 100 can be improved in strength. The multiple insulating layers (11, 110) may be respectively formed of different materials, or may all be formed of the same material. The insulating layer 110 can be a solder resist layer formed using, for example, a photosensitive polyimide resin or epoxy resin or the like.

The conductor layers (12, 120) forming the wiring substrate 100 can each be formed using any material having suitable conductivity such as copper or nickel. The conductor layers (12, 120) are each formed of, for example, a metal film (preferably an electroless copper plating film) or an electrolytic plating film (preferably an electrolytic copper plating film), or a combination thereof. In the example illustrated in FIG. 1, the conductor layers (12, 120) are each formed to have a two-layer structure including a metal film layer 121 and an electrolytic plating film layer 122. However, the structure of each of the conductor layers (12, 120) forming the wiring substrate 100 is not limited to the multilayer structure illustrated in FIG. 1. For example, the conductor layers (12, 120) may each have a single layer structure including an electroless plating film layer or an electrolytic plating film layer. Further, the conductor layers 12 may each have a three-layer structure including a metal foil, an electroless plating film layer, and an electrolytic plating film layer.

As illustrated in FIG. 1, the via conductors (13, 130) can be integrally formed with the metal film layer (electroless plating film layer) 121 and the electrolytic plating film layer 122 that form the conductor layers (12, 120). In the example illustrated in FIG. 1, the via conductors (13, 130) are so-called filled vias filling conduction holes (through holes) (11a, 110a), and are formed of the metal film layer 121 and the electrolytic plating film layer 122, which cover bottom surfaces and side surfaces in the conduction holes (11a, 110a).

Figure 2:
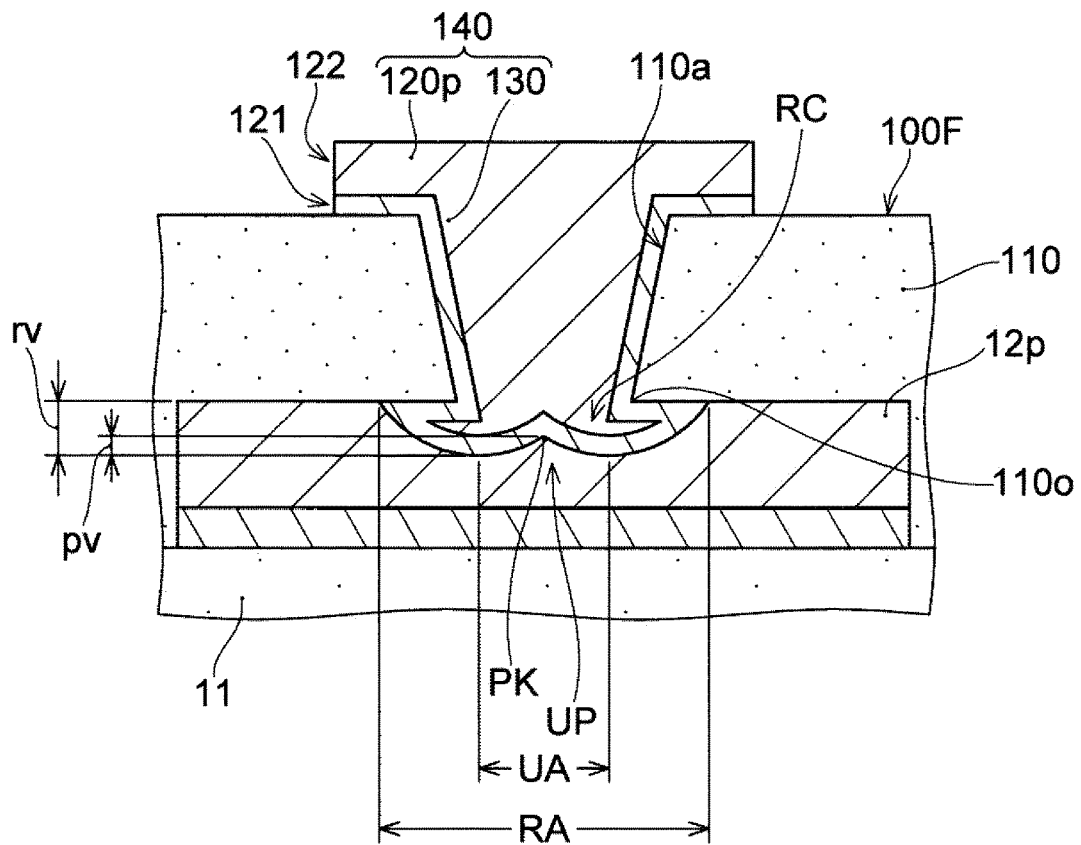
FIG. 2 is a partial enlarged cross-sectional view of the wiring substrate of FIG. 1.

Next, with reference to FIG. 2, a connection structure between the conductor pads (12p) and the bumps 140, in particular, the concave part (RC) formed in each of the conductor pads (12p) is described in detail. FIG. 2 is an enlarged view of a region (II) surrounded by a one-dot chain line in FIG. 1. The concave part (RC) formed on a surface of each of the conductor pads (12p) is formed over a region (RA) in a planar direction of the conductor pads (12p). In a plan view, the region (RA) is a region larger than a region defined by a peripheral edge (110o) on the conductor pads (12p) side of each of the through holes (110a) formed in the insulating layer 110. The term "plan view" means viewing the wiring substrate 100 along its thickness direction.

An inner surface of the concave part (RC) has the convex part (UP) that rises towards the component mounting surface (100F). Here, the convex part (UP) has an apex (PK) that is closer to the component mounting surface (100F) than its surrounding on the inner surface of the concave part (RC), and is a portion that is formed over a region (UA) including a portion inclined from its surrounding toward the apex (PK). The apex (PK) of the convex part (UP) has a height (pv) with respect to a deepest part (a portion closest to the insulating layer 11) of the inner surface of the concave part (RC). In the illustrated example, the concave part (RC) has the same depth (rv) on one side and the other side of the apex (PK). However, the concave part (RC) is not limited to have such a shape, and can have different depths on one side and the other side of the apex (PK). That is, it is also possible that the convex part (UP) has an asymmetrical shape with respect to the apex.

The metal film layer 121 forming the bumps 140 covers the inner surface of the concave part (RC), and the electrolytic plating film layer 122 fills the concave part (RC). When the concave part (RC) having such a convex part (UP) is formed at each of the connecting parts between the bumps 140 and the conductor pads (12p), a relatively strong connection structure between the bumps 140 and the conductor pads (12p) can be provided.

In the wiring substrate 100, as compared to a case where the concave part (RC) having the convex part (UP) is not formed in each of the conductor pads (12p), a wider connection area between the bumps 140 and the conductor pads (12p) can be ensured. Therefore, a strong connection structure can be ensured against a stress that can be exerted on the connecting parts between the conductor pads (12p) and the bumps 140. In particular, a relatively strong connection structure can be obtained against a shear stress in the planar direction of the wiring substrate 100 that can be exerted on interfaces between the conductor pads (12p) and the bumps 140. Occurrence of a defect such as peeling between the conductor pads (12p) and the bumps 140 can be suppressed.

Further, due to an anchor effect between the convex parts (UP) and the bumps 140, mechanical coupling strength between the bumps 140 and the conductor pads (12p) can be improved. The connection structure between the bumps 140 and the conductor pads (12p) can have a high rigidity against an external force that can be exerted on the bumps 140, for example, when an electronic component is placed on upper parts of the bumps 140. A defect such as peeling of the bumps 140 from the conductor pads (12p) can be effectively suppressed.

From a point of view of making the connection structure between the bumps 140 and the conductor pads (12p) strong against an external force exerted on the bumps 140 from an unspecified direction, the apex (PK) of the convex part (UP) is preferably formed in a region on an inner side of an opening on the conductor pads (12p) side of each of the through holes (110a) (a region defined by the peripheral edge (110o)) in a plan view.

From the same point of view, the height (pv) of the apex (PK) of the convex part (UP) is preferably 0.10 or more times the depth (rv) of the deepest part of the concave part (RC). However, when the height (pv) of the apex (PK) of the convex part (UP) is excessively large, a stress exerted on a connecting surface between the bumps 140 and the conductor pads (12p) is concentrated near the apex (PK), which may be unfavorable from a point of view of stress distribution. Therefore, the height (pv) of the apex (PK) of the convex part (UP) is preferably 0.50 or less times the height (rv) of the deepest part of the concave part (RC).

The concave part (RC) is formed to have a depth that allows the connection structure between the bumps 140 and the conductor pads (12p) to be effectively strengthened according to a thickness of each of the conductor pads (12p), dimensions of each of the via conductors 130 in the planar direction, and the like. In the wiring substrate 100 of the illustrated example, the thickness of each of the conductor pads (12p) is about 12 μm, and the depth (rv) of the deepest part of the concave part (RC) is 1 μm or more and 10 μm or less. And, a longest distance between two points on an outer periphery of a horizontal cross section of each of the via conductors 130 forming the bumps 140 is 10 μm or more and 35 μm or less.

Figure 3:
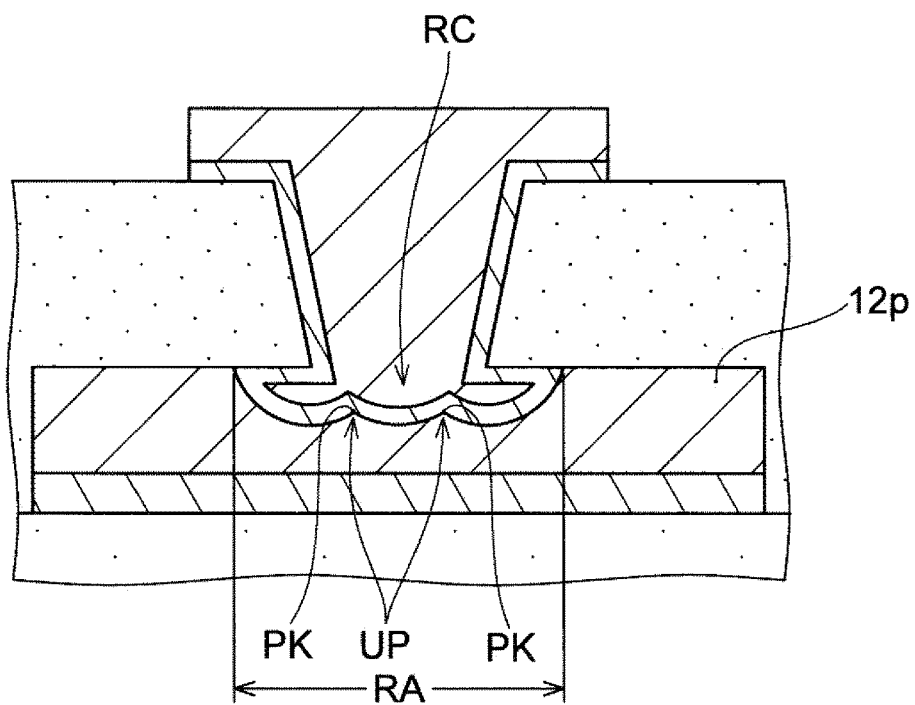
FIG. 3 is a cross-sectional view illustrating a different example of the wiring substrate illustrated in FIG. 2.

From a point of view of expanding the connection area at the connecting parts between the bumps 140 and the conductor pads (12p), and from a point of view of improving the mechanical coupling strength due to the anchor effect of the connecting parts between the bumps 140 and the conductor pads (12p), multiple convex parts (UP) can be formed in the concave part (RC). FIG. 3 illustrates an example in which two convex parts (UP) are formed in the concave part (RC) of each of the conductor pads (12p). When multiple convex parts (UP) are formed in the concave part (RC), from a point of view of evenly distributing a stress in the connecting surface, it is preferable that the multiple convex parts (PK) are relatively evenly distributed without being locally unevenly distributed in the region (RA) where the concave part (RC) is formed.

Figure 4:
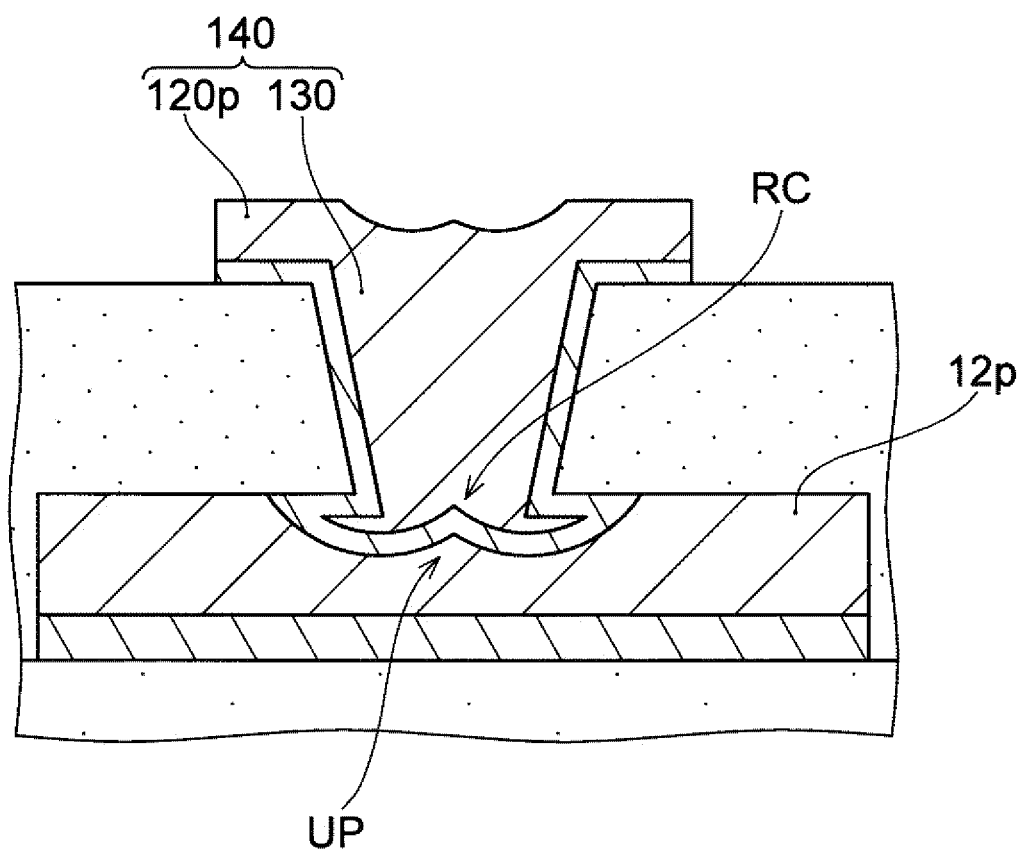
FIG. 4 is a cross-sectional view illustrating another different example of the wiring substrate illustrated in FIG. 2.

As illustrated in FIG. 4, on each of exposed surfaces (upper surfaces of the connection pads (120p)) of the bumps 140 connected on the conductor pads (12p), a concave part having a shape corresponding to the concave part (RC) and a convex part having a shape corresponding to the convex part (UP) may be formed. For example, a connection area between the bumps 140 and connecting members such as solders that can be connected to the bumps 140 can be expanded, and mechanical coupling strength can also be improved. Therefore, occurrence of a defect such as peeling of the connecting members on the upper surfaces of the bumps 140 can be suppressed. Connection reliability between the wiring substrate 100 and an external electronic component or the like can be improved.

Figure 5:
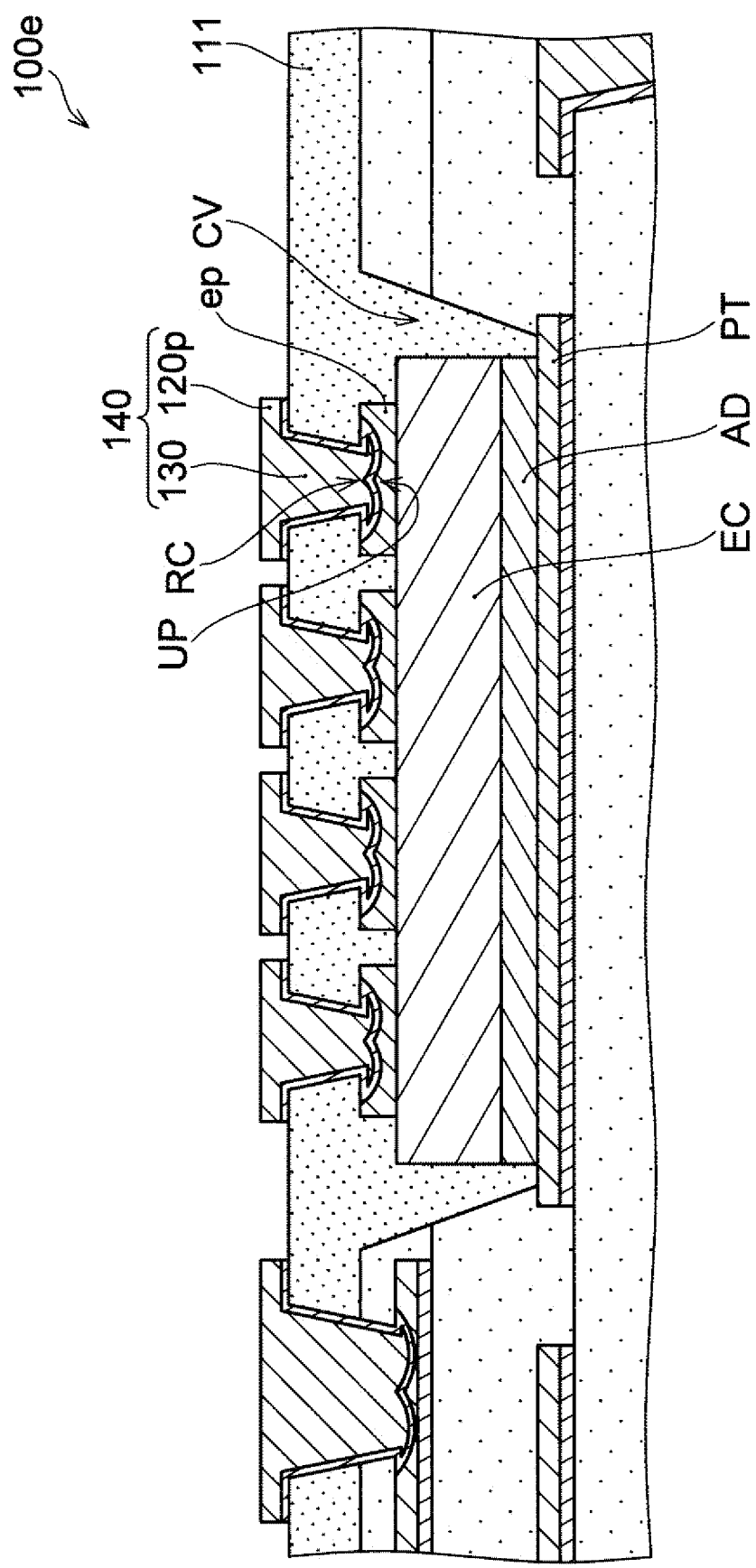
FIG. 5 is a cross-sectional view illustrating another example of a wiring substrate according to an embodiment of the present invention.

The wiring substrate of the present embodiment can be a component built-in wiring substrate having a built-in electronic component. Then, the conductor pads having the concave parts on their surfaces can be electrode pads of the electronic component of the component built-in wiring substrate. FIG. 5 illustrates an example in which, in a component built-in wiring substrate (100e) having a built-in electronic component (EC), electrode pads (ep) of the electronic component (EC) are connected to the bumps 140. On each of surfaces of the electrode pads (ep) connected to the bumps 140, a concave part (RC) having a convex part (UP) is formed.

In the component built-in wiring substrate (100e) of the example illustrated in FIG. 5, the electronic component (EC) is mounted via an adhesive (AD) on a bottom surface of a cavity (CV), the bottom surface being formed of a component mounting pad (PT). The electronic component (EC) is, for example, an active component such as a semiconductor device or a passive component such as a resistor. Examples of the adhesive (AD) include a conductive adhesive that contains a metal such as solder, gold, or copper, and contains any conductive particles such as silver particles, and an insulating adhesive simply formed of an epoxy resin or the like.

The electronic component (EC) is sealed in the cavity (CV) by a resin insulating layer 111 that covers the electronic component (EC). On the electrode pads (ep) of the electronic component (EC), which are used for connecting the electronic component (EC) to an external circuit, the bumps 140 formed of the via conductors 130 and the connection pads (120p) are connected, the via conductors 130 penetrating the resin insulating layer 111. By forming the concave part (RC) having the convex part (UP) in each of the electrode pads (ep), a relatively strong connection structure between the electrode pads (ep) and the bumps 140 is realized. A component built-in wiring substrate (100e) having a high connection reliability between an external circuit and the electronic component (EC) can be provided.

The portion where the above-described concave part (RC) having the convex part (UP) is formed is not limited to the connecting parts between the bumps 140 and the conductor pads (12p) (electrode pads (ep)) in the wiring substrates (100, 100e). The same concave parts as the concave parts (RC) of the conductor pads (12p) may be formed in the conductor layers 12 at connecting parts between any via conductors 13 and the conductor layers 12 that form the wiring substrates (100, 100e).

Figure 6A:
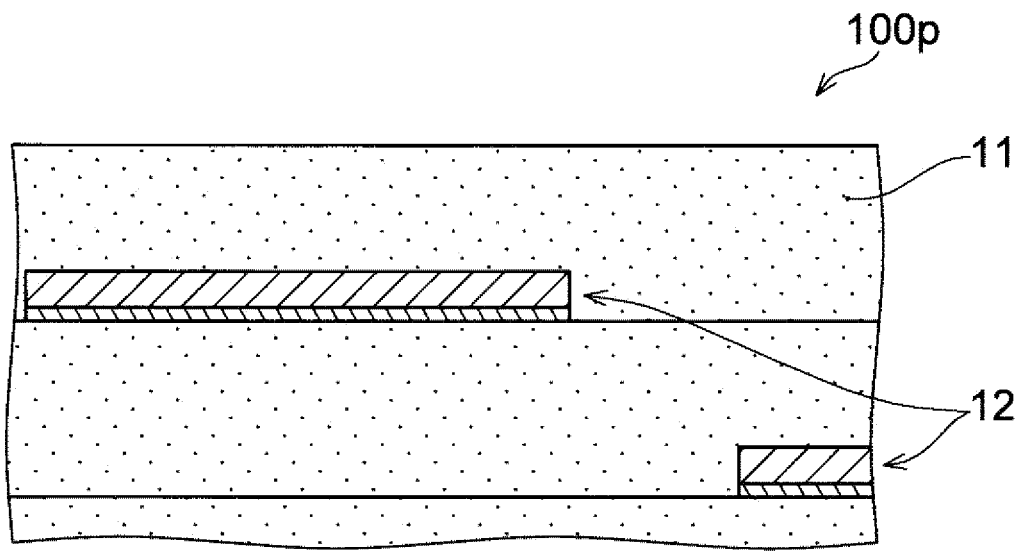
FIG. 6A illustrates an example of a method for manufacturing the wiring substrate illustrated in FIG. 1 according to an embodiment of the present invention.
Figure 6B:
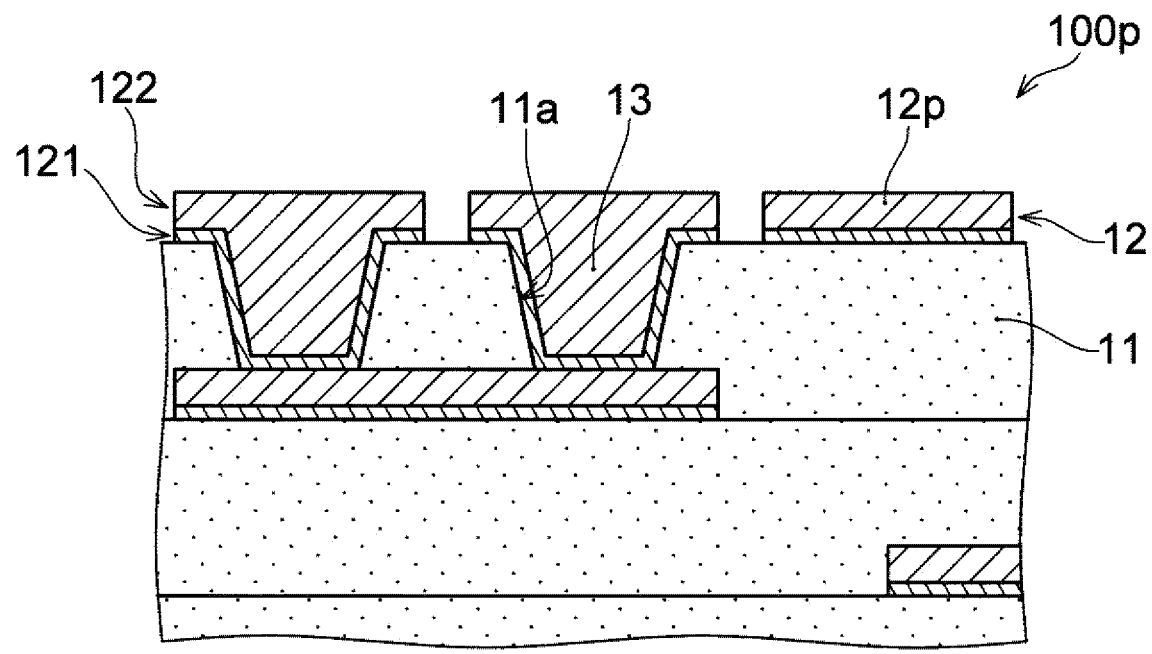
FIG. 6B illustrates an example of a method for manufacturing the wiring substrate illustrated in FIG. 1 according to an embodiment of the present invention.
Figure 6C:
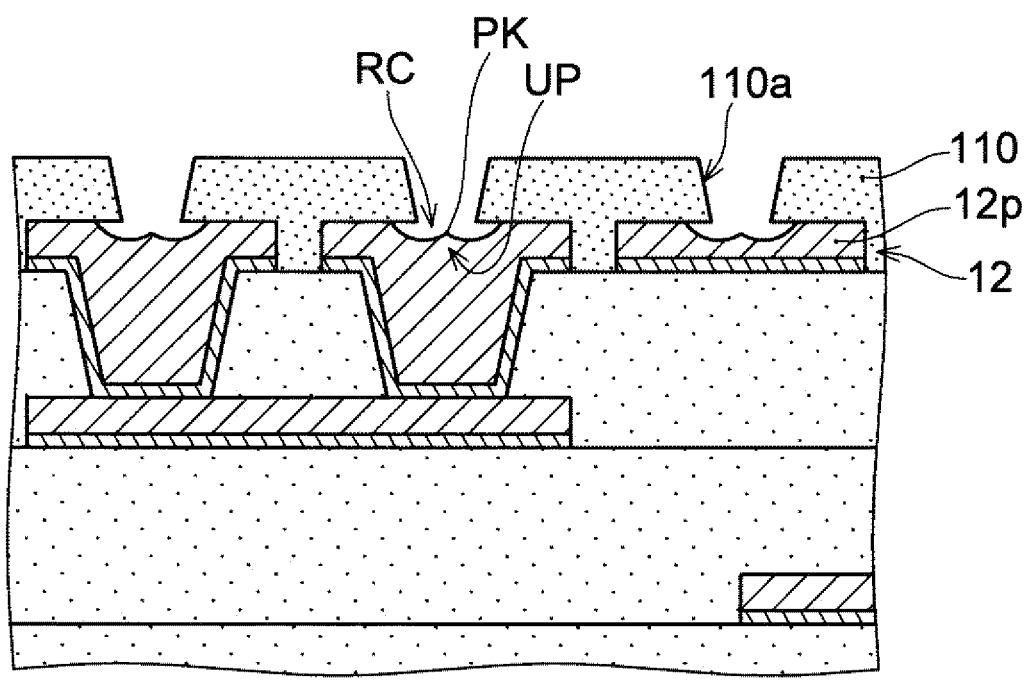
FIG. 6C illustrates an example of a method for manufacturing the wiring substrate illustrated in FIG. 1 according to an embodiment of the present invention.

In the following, a method for manufacturing the wiring substrate 100 illustrated in FIG. 1 is described with reference to FIGS. 6A-6C. In FIGS. 6A-6C, similar to FIG. 1, the wiring substrate 100 is not entirely illustrated, and only a partial cross section of the component mounting surface (100F) side including the connecting parts between the bumps 140 and the conductor pads (12p) is illustrated.

First, as illustrated in FIG. 6A, for example, a wiring substrate (100p) is prepared for which processing up to the lamination of the insulating layer 11 has been completed using a common method for manufacturing a wiring substrate based on a build-up method.

Next, as illustrated in FIG. 6B, the conductor layer 12 including the conductor pads (12p) is formed on the outermost insulating layer 11, and at the same time, the via conductors 13 penetrating the insulating layer 11 are formed. At positions corresponding to formation sites of the via conductors 13 in the outermost insulating layer 11 of the wiring substrate (100p), the conduction holes (11a) penetrating the insulating layer 11 are formed, for example, by irradiating laser such as CO2 laser or YAG laser. The metal film layer 121, which is, for example, an electrolytic copper plating film layer, is formed by electroless plating on inner sides of the conduction holes (11a) and over the entire surface of the insulating layer 11.

On the metal film layer 121, a plating resist (not illustrated in the drawings) for electrolytic plating is formed, for example, by forming a resin layer containing a photosensitive polyhydroxy ether resin, epoxy resin, phenol resin, or polyimide resin, or the like, and by performing exposure and development using a mask having appropriate opening patterns. The plating resist is formed to have openings corresponding to predetermined conductor patterns including the conductor pads (12p), and the conduction holes (11a) of the insulating layer 11 and the openings of the plating resist are filled by electroplating using the metal film layer 121 as a seed layer. Next, the metal film layer 121 exposed by removing the plating resist is removed by etching, and the resin insulating layer 11 is exposed. The formation of the via conductors 13, and the conductor layer 12 including the conductor pads (12p), is completed.

Next, as illustrated in FIG. 6C, the insulating layer 110 is laminated on the conductor layer 12 including the conductor pads (12p) and on the exposed insulating layer 11. The insulating layer 110 can be formed of, for example, an insulating resin containing a photosensitive epoxy resin or polyimide resin, or the like. Subsequently, the openings (through holes) (110a) are formed corresponding to positions where the via conductors 130 of the insulating layer 110 are formed. The through holes (110a) penetrate the insulating layer 110 to expose the surfaces of the conductor pads (12p). Photolithography can be used in the formation of the through holes (110a). It is also possible that the through holes (110a) are formed, for example, by irradiating laser such as UV laser.

Subsequently, the conductor pads (12p) exposed at bottom surfaces of the through holes (110a) are etched, and the concave parts (RC) are formed. For example, the concave part (RC) is formed in each of the conductor pads (12p) by isotropic wet etching using a chemical solution containing an oxidizing agent such as an alkaline permanganate aqueous solution. Depending on processing conditions of the etching (chemical solution concentration, processing time, and the like), a concave part (RC) having any shape and dimensions can be formed. Specifically, the depth of the concave part (RC), the number of the convex parts (UP), the height of the apex (PK) of each of the convex parts (UP), and the like can be freely adjusted depending on the processing conditions of the etching.

Next, the bumps 140 are formed in the through holes (110a) and on the insulating layer 110, and the formation of the wiring substrate 100 is completed (FIG. 1). The bumps 140 can be formed using the same method and the same material as used in forming the via conductors 13 and the conductor layer 12 described above. The metal film layer 121 is formed in the through holes (110a) and on the insulating layer 110, and, by electrolytic plating using the metal film layer 121 as a seed layer, the conductor layer 120 and the via conductors 130 formed of the metal film layer 121 and the electrolytic plating film layer 122 are formed. The formation of the bumps 140 formed of the connection pads (120p) of the conductor layer 120 and via conductors 130 is completed.

On each of the connection pads (120p) forming the bumps 140, a surface protective film (not illustrated in the drawings) formed of Au, Ni/Au, Ni/Pd/Au, solder, heat-resistant preflux, or the like may be formed by electroless plating, solder leveling, spray coating, or the like. Through the above processes, the wiring substrate 100 illustrated in FIG. 1 is completed.

It is also possible that the formation of the bumps 140 is realized by performing only electroless plating on the conductor pads (12p) each having the concave part (RC) and the bumps 140 are mainly formed of an electroless plating film 121. In this case, a catalyst for plating deposition is applied to the inner surface of the concave part (RC), and the electroless plating film grows upward from the inner surface of the concave part (RC) in a so-called bottom-up manner. Therefore, it may be possible that the bumps 140 each having a surface shape that reflects the shape of the concave part (RC) of each of the conductor pads (12p) as illustrated in FIG. 4 are easily formed.

The wiring substrate of the embodiment is not limited to a wiring substrate having the structures exemplified in the drawings, or the structures or materials exemplified in the present specification. For example, the component mounting surface (100F) may include different conductor patterns in addition to the connection pads (120p). It is also possible that bumps 140 are formed of only the via conductors 130 without having the connection pads (120p) that each spread out flatly. The apexes (PK) of the multiple convex parts (UP) that can be formed in the concave part (RC) may have different heights relative to the deepest part of the concave part (RC). Further, the method for manufacturing the wiring substrate is not limited to the method described with reference to the drawings, and conditions, processing order, and the like of the method can be modified as appropriate. Depending on a structure of an actually manufactured wiring substrate, some of the processes may be omitted, or other processes may be added.

In the wiring substrate of Japanese Patent Application Laid-Open Publication No. 2014-103295, since the connecting surface between the connection pad and the metal layer is a gentle curved surface, it is considered that there is a risk that a defect such as peeling may occur due to a stress exerted on the connecting surface between the connection pad and the metal layer caused by an external force applied to the bump electrode.

A wiring substrate according to an embodiment of the present invention includes: a conductor pad; an insulating layer that is formed on the conductor pad; and a bump that is formed on the conductor pad and is formed in a through hole penetrating the insulating layer. A concave part is formed on a connecting surface of the conductor pad to the bump, and a convex part is provided in the concave part.

According to an embodiment of the present invention, it is possible to provide a wiring substrate that has a relatively strong connection structure between a conductor pad and a bump and in which occurrence of a defect such as peeling is suppressed against a stress that may be exerted on a connecting surface.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising:
a conductor pad;
an insulating layer formed on the conductor pad such that the insulating layer is covering the conductor pad and has a through hole; and
a bump formed on the conductor pad such that the bump is formed in the through hole penetrating through the insulating layer,
wherein the conductor pad is formed such that the conductor pad has a connecting surface connected to the bump, a concave part formed on the connecting surface of the conductor pad to the bump, and a convex part formed in the concave part.

2. The wiring substrate according to claim 1, wherein the conductor pad is formed such that the concave part is formed over a region that is wider than an opening of the through hole on a conductor pad side.

3. The wiring substrate according to claim 1, wherein the conductor pad is formed such that the convex part has an apex formed in a region on an inner side of an opening of the through hole on a conductor pad side.

4. The wiring substrate according to claim 1, wherein the conductor pad is formed such that the convex part is formed in a plurality in the concave part.

5. The wiring substrate according to claim 1, wherein the conductor pad is formed such that the convex part has a height in a range of 0.10 to 0.50 times a depth of a deepest part of the concave part.

6. The wiring substrate according to claim 5, wherein the conductor pad is formed such that the depth of the deepest part is in a range of 1 µm to 10 µm.

7. The wiring substrate according to claim 1, wherein the bump is formed such that a longest distance between two points on an outer periphery of a horizontal cross section in a portion of the bump in the through hole is in a range of 10 µm to 35 µm.

8. The wiring substrate according to claim 1, wherein the bump is formed such that the bump has a surface on an opposite side with respect to the conductor pad and has a recessed part and a raised part having shapes corresponding the concave part and convex part of the conductor pad.

9. A component built-in wiring substrate, comprising:
the wiring substrate of claim 1 formed such that the conductor pad is configured to be connected to a built-in electronic component.

10. A component built-in wiring substrate, comprising:
the wiring substrate of claim 1; and
a built-in electronic component mounted to the wiring substrate such that the built-in electronic component is connected to the conductor pad of the wiring substrate.

11. The wiring substrate according to claim 1, wherein the bump and the conductor pad comprise a same material.

12. The wiring substrate according to claim 1, wherein the bump and the conductor pad comprise copper plating.

13. The wiring substrate according to claim 2, wherein the conductor pad is formed such that the convex part has an apex formed in a region on an inner side of an opening of the through hole on a conductor pad side.

14. The wiring substrate according to claim 2, wherein the conductor pad is formed such that the convex part is formed in a plurality in the concave part.

15. The wiring substrate according to claim 2, wherein the conductor pad is formed such that the convex part has a height in a range of 0.10 to 0.50 times a depth of a deepest part of the concave part.

16. The wiring substrate according to claim 15, wherein the conductor pad is formed such that the depth of the deepest part is in a range of 1 µm to 10 µm.

17. The wiring substrate according to claim 2, wherein the bump is formed such that a longest distance between two points on an outer periphery of a horizontal cross section in a portion of the bump in the through hole is in a range of 10 µm to 35 µm.

18. The wiring substrate according to claim 2, wherein the bump is formed such that the bump has a surface on an opposite side with respect to the conductor pad and has a recessed part and a raised part having shapes corresponding the concave part and convex part of the conductor pad.

19. The wiring substrate according to claim 3, wherein the conductor pad is formed such that the convex part is formed in a plurality in the concave part.

20. The wiring substrate according to claim 3, wherein the conductor pad is formed such that the convex part has a height in a range of 0.10 to 0.50 times a depth of a deepest part of the concave part.

* * * * *